United States Patent
Pittaluga et al.

(10) Patent No.: US 6,462,543 B2
(45) Date of Patent: Oct. 8, 2002

(54) METHOD, INSTRUMENT AND SYSTEM FOR PERFORMING VERIFICATION MEASUREMENTS AND CORRECTIONS OF MAGNETIC FIELDS IN MAGNETS FOR NUCLEAR MAGNETIC RESONANCE IMAGING MACHINES

(75) Inventors: Stefano Pittaluga; Alessandro Trequattrini; Davide Carlini, all of Genoa (IT)

(73) Assignee: Esaote, S.p.A., Monferrato (IT)

( * ) Notice: Subject to any disclaimer, the term of this patent is extended or adjusted under 35 U.S.C. 154(b) by 0 days.

(21) Appl. No.: 09/789,506

(22) Filed: Feb. 22, 2001

(65) Prior Publication Data

US 2001/0030538 A1 Oct. 18, 2001

(30) Foreign Application Priority Data

Feb. 25, 2000 (IT) .................................... SV2000A0009

(51) Int. Cl.[7] ................................................. G01V 3/00
(52) U.S. Cl. ........................ 324/308; 324/307; 324/320; 324/309
(58) Field of Search ................................ 324/308, 309, 324/318, 322, 300, 307, 310

(56) References Cited

U.S. PATENT DOCUMENTS

| | | | |
|---|---|---|---|
| 4,791,369 A | 12/1988 | Yamamoto et al. | 324/312 |
| 5,055,791 A | 10/1991 | LeRoux et al. | 324/318 |
| 5,208,533 A | * 5/1993 | Roux | 324/307 |
| 5,545,995 A | 8/1996 | Schneider et al. | 324/318 |
| 6,037,775 A | * 3/2000 | Shenoy et al. | 324/320 |

FOREIGN PATENT DOCUMENTS

| | | | |
|---|---|---|---|
| EP | 0 230 027 | 7/1987 | G01V/3/00 |

* cited by examiner

*Primary Examiner*—Edward Lefkowitz
*Assistant Examiner*—Brij B. Shrivastav
(74) *Attorney, Agent, or Firm*—Burns, Doane, Swecker & Mathis, L.L.P.

(57) ABSTRACT

The invention is directed to a method, an instrument and a system for performing verification measurements and corrections of magnetic fields in magnets for Nuclear Magnetic Resonance imaging machines. According to the invention, test elements are used whereof Nuclear Magnetic Resonance images are detected. Then, these actually detected images are compared with the theoretical images which would be obtained in ideal conditions. The number, magnitude and position of correcting magnetic charges are determined from the differences between the actual image and the theoretical image. The invention is also directed to a specific test element and to a Nuclear Magnetic Resonance imaging machine.

30 Claims, 8 Drawing Sheets

METHOD, INSTRUMENT AND SYSTEM FOR PERFORMING VERIFICATION MEASUREMENTS AND CORRECTIONS OF MAGNETIC FIELDS IN MAGNETS FOR NUCLEAR MAGNETIC RESONANCE IMAGING MACHINES This application claims priority under 35 U.S.C. §§119 and/or 365 to SV2000A000009 filed in Italy on Feb. 25, 2000; the entire content of which is hereby incorporated by reference.

The invention is directed to a method for performing verification measurements and corrections of magnetic fields in magnets for Nuclear Magnetic Resonance imaging machines, comprising the following steps:

making a test member having such characteristics as to generate predetermined and known Nuclear Magnetic Resonance images;

obtaining a Magnetic Resonance image from said test member;

comparing the known theoretical image with the detected image and/or the received signals wherefrom the detected image is reconstructed with the corresponding set of signals, related to the known theoretical image in any of their processing or imaging steps;

determining the differences between the detected image and the known image or between the set of detected signals and the set of signals corresponding to the known image;

determining correction parameters, i.e. the correcting magnetic charge and/or the number of correcting magnetic charges having a predetermined value, or the volumes of ferromagnetic material and their position on the magnetic structure.

Nuclear Magnetic Resonance imaging machines use electromagnetic echoes of previously excited nuclei to retrieve therefrom information for imaging. In order to obtain echo signals allowing to reconstruct images sufficiently corresponding to reality, at least a considerable number of the nuclei of the material being examined must be oriented with substantially parallel spins. To this end, static magnetic fields are used which must be comparatively intense and constant within a predetermined volume corresponding to a body part to be examined.

At the same time, additional magnetic fields are applied, the so-called gradients, which are used to select certain sections of the body part to be examined and to create a parameter for identifying the signal received from individual portions of the section under examination so that signals can be ordered for two- or three-dimensional imaging.

The tolerances required for a good correspondence between reality and the reconstructed image are very small, being of the order of a few millionths deviations from nominal values. Moreover, since the magnetic fields in use are relatively intense, the constructions of magnets have a considerable size, whereby the physically huge structure hinders the required construction accuracy. This is particularly relevant for the so-called permanent magnets, in which the magnetic field is generated by permanently magnetized materials and not by induction generators.

After manufacture, magnets are submitted to fine calibration of the magnetic field, the so-called shimming, which is designed to correct construction inaccuracies of the individual parts of the magnet, and includes measuring the static field by a probe, detecting aberrations with respect to nominal values and disposing magnetized or ferromagnetic correcting elements in several appropriate areas of the magnet structure as determined from the differences between the nominal values and the actual values of the field within the volume designed to accommodate the body or the body part under examination. Shimming is performed during fabrication at the manufacturer's site. This technique is described in greater detail, for instance, in patent application SV98A000015 filed by the applicant hereof.

Nevertheless, frequently and unavoidably, upon installation at the customer's site, manufacture settings appear to be changed or perturbed. This is especially caused by stresses acting on the big metal masses which form the magnetic structure, especially as this structure has a modular construction, or made of several parts fastened together.

Further, the personnel using the machines is not sufficiently qualified to verify their operating accurateness during use, except in a few exceptional cases. Hence, little aberrations might remain unnoticed.

Due to this, a problem arises to make functional testing of machines easier, at least below a certain accuracy degree, in an easy and safe manner, even for personnel less qualified than the personnel charged of fabricating and testing the machines at the manufacturer's site.

Document EP-A-0230027 discloses a method and a device according the above described method and which attempts to solve the above disclosed problems. Also U.S. Pat. No. 5,545,995 and U.S. Pat. No. 5,055,791, disclose method of the kind described above.

The known disclosed methods, suggest solutions to the problem of testing and correcting imaging aberrations and anomalies in which the image of the phantom is determined by a combination of several coefficients of the theoretical mathematical function which describes the field and which combination of coefficients includes coefficients of low and high order. Carrying out the correction of the field under these circumstances requests very long calculations which are not necessary to achieve a practical level of precision of the field. Indeed in the disclosed solutions the structure of the phantom is not suited to the structure of the function describing the field being normally a spherical polynomial expansion. The images of the phantom and the aberrations thereof from the theoretical image are not determined only by a small number of low order coefficients of the polynomial expansion. Thus as stated above the mathematical comparison of the real image of the phantom and of the theoretical image and the calculation of the correction to be applied to the field are very complicated and time consuming.

The invention has the main object to allow fast functional testing of the magnetic structure of Nuclear Magnetic Resonance machines, particularly after installation, in a relatively fast and simple manner.

The invention has the further object to allow an at least partly automatic correction of aberrations and anomalies occurring after installation without requiring special laboratory equipment, which is complex and costly and may be only used by very highly knowledgeable and specialized personnel.

The invention also aims at setting the bases for implementation of several automation degrees of the correction to be performed, with the smallest number of operation steps which might be carried out by an average specialized technician, specifically trained in the maintenance of one or more specific machines.

The invention achieves the above purposes with a method for performing verification measurements and corrections of magnetic fields in magnets for Nuclear Magnetic Resonance imaging machines, in which A mathematical theoretical function describing the field is choosen, particularly a polynomial expansion, preferably a spherical polynomial expansion, A phantom is provided with a structure suited to the said function describing the field and which produces one or more selected images, each of these images being correlated to one or to a limited number of selected low order coefficients of the function describing the field, such that the differences between a theoretical image of the phantom and the real image of the phantom depends only to the one or to the limited number of selected coefficients of the function describing the magnetic field.

Thus by selecting a specific mathematical structure for describing the field, for instance and preferably but without limitation, a representation of the field by spherical harmonics, the above method may be refined so that several orders and degrees of harmonics, and hence of field coefficients may be examined individually.

In this case, the method provides that the test member has elements which do not emit Nuclear Magnetic Resonance signals and are defined transparent in the following text and claims, which are related to a definite harmonic or to precise coefficients of a certain order of a mathematical description of the field by a polynomial expansion, preferably by spherical harmonics, there being provided means for application of so-called reading gradients of the magnetic field, which only detect the echo signal along certain directions, said directions being selected in such a manner as to suppress the contributions from the magnetic field described by coefficients other than the ones being examined.

Preferably but without limitation, the describing polynomial expansion is selected in spherical harmonics. Nevertheless, other polynomial expansions may be more or less suitable for the purpose, also depending on the symmetries of the field and hence of the magnetic structure.

In accordance with a preferred embodiment of the method, the latter includes the following steps:

a) detecting the image of the predetermined test element;

b) symmetrizing deviations between the actually detected image and the nominal, ideal one, with respect to the center of the image and/or to the predetermined origin of the coordinate system for the mathematical description of the magnetic field;

c) defining a curve of symmetrized deviations having the relevant field coefficients as a variable;

d) determining a polynomial for approximating the curve of symmetrized deviations, deriving from the differences betweem the actual image and the ideal, theoretical image;

e) determining the coefficients based on the system of the two consistent equations of steps c) and d);

f) computing, from the mathematical description in spherical harmonics of the field, such number, magnitude and position on the magnetic structure of the correcting elements as magnetic charges or volumes of ferromagnetic material, as to bring the measured values of the field coefficients back within the nominal values corresponding to the homogeneity characteristics of the field required for detecting useful Nuclear Magnetic Resonance images;

g) manually positioning such charges on the magnetic structure.

Possibly, once correction has been performed, steps a) to f) may be repeated to verify the effectiveness of said correction and, when necessary, an additional correction step g) may be performed.

The elements for verifying the different coefficients may be progressively mounted on the test member or fixedly provided thereon.

Each of these elements corresponds to at least one harmonic or to at least one set of coefficients and are made consistently with the selected mathematical description of the field and/or eventually to the symmetries of the magnetic structure.

According to a first embodiment, the method provides a manual graphic comparison between the detected images and the theoretical images wherefrom the mathematical computation is performed to determine correction data.

In this case, the machine will have a theoretical comparison image, for instance stored therein.

Alternatively, the method provides that the machine determines quantitatively the differences between the ideal image and the detected image by computation of the distance in pixels of the point or portion or area of the detected image from the position of the corresponding point or area of the ideal image. In this case, the difference may be easily changed to an aberration or deviation quantitative value with respect to the theoretical image and directly used in the machine thanks to the processing hardware contained therein and to software for effecting comparisons, tests and error diagnostics. Hence, computation software, also stored in the processing hardware of the machine may compute the required corrections and indicate correction absolute data.

In these conditions, the operator would only have to physically position the correction charges, based on the magnitude suggested by the machine, in the position/s automatically determined by the machine.

In a specific embodiment, the method provides the use of a test element whose non-detectable portion has the form of a rib, stem or baffle whose longitudinal orientation is parallel to the static magnetic field, i.e. disposed in the axial section plane of the magnetic field when the latter is described with spherical harmonics. In a description by a polynomial expansion with spherical harmonics, this stem is related to (2 0) and (4 0) cosine coefficients.

From two crossed baffles which form an angle of 109.472°, symmetrically with respect to one of the two axes which describe the axial section plane of the magnetic field, the coefficients of the (2 2) cosine and of the (2 1) sine are obtained.

Similarly, from two crossed baffles which form an angle of 90°, symmetrically with respect to an axis which describes the coronal section plane of the static magnetic field the coefficients of the (2 2) sine are obtained, whereas from the same baffle configuration, with baffles disposed in the sagittal section plane of the static magnetic field, the coefficients of the (2 1) cosine are obtained.

When these coefficients are verified and, if needed, corrected, they are sufficient to ensure a good accuracy of the field to obtain the tolerances required for detecting useful Nuclear Magnetic Resonance images.

It has to be noted that (x y) typically defines the indexes of the polynomial expansion.

The invention is also directed to a test element including, separately or in combination, the above baffles.

In the preferred embodiment, such test element includes a central rectilinear baffle which is crossed, with reference to the plane parallel to a peripheral edge, by two crossed baffles, passing through the median area of the rectilinear baffle and forming, symmetrically with respect to the rectilinear baffle, an angle of 109.472°, whereas two additional crossed baffles are provided in the plane perpendicular to the rectilinear baffle and containing the other sides thereof, which form, symmetrically with respect to said rectilinear baffle, an angle of 90° and intersect the rectilinear baffle in the central area.

Advantageously, the baffles consist of walls and are made of plastic, particularly of the so-called Plexiglas.

In accordance with the illustrated preferred embodiment, the different baffles made of a material which emits no Nuclear Magnetic Resonance signal are mounted in a fixed manner inside a plastic container filled with a liquid which emits a Nuclear Magnetic Resonance signal, e.g. water or other liquids or solutions.

It has to be noted how the creation of contact surfaces between materials differing with respect to Nuclear Magnetic Resonance signals is relevant to generate image contrasting imaging areas, having predetermined shapes. Obviously, said preferred construction allows the method to be implemented even when the materials composing the baffles and the filling are inverted.

The box or container have a filler opening with sealing means.

The advantages of the present invention are apparent from the above disclosure. Thanks to the verification and correction method, the homogeneity accuracy of the magnetic field may be periodically controlled in an easy manner, manually and/or with different automation degrees. This feature is primarily important for obtaining Nuclear Magnetic Resonance images with a good correspondence with reality, hence it is the basis to obtain diagnostically usable images.

Verification and, when needed, correction activities, may be automated to such an extent that they may be performed by an average specialized operator, without requiring any intervention of highly specialized personnel, which involve high costs both for the manufacturer and for the customer.

Further, verification and correction times are drastically reduced, thereby limiting downtime, which causes discomfort for users.

The required process and devices are relatively inexpensive, mainly involving the addition of software procedures in existing machine elements, which only need to be enhanced, and the provision of a set of correction permanent magnets, as well as of a phantom. The latter is the only construction element which has to be specially fabricated for an easy application of the method.

However, the phantom itself is in no way necessary, the verification and correction procedures being performable, by following the above method steps, with hand-made elements or improvised members.

Further improvements of the invention will form the subject of the subclaims.

BRIEF DESCRIPTION OF THE DRAWINGS

The characteristics of the invention and the advantages derived therefrom will appear more clearly from the following description of a non limiting embodiment, illustrated in the annexed drawings, in which:

FIGS. 1A and 1B to 4A and 4B show schematically by a tridimensional view and a plan view on the specific extension plane, the test elements for verification of specific field coefficients according to a spherical polynomial expansion.

DETAILED DESCRIPTION OF THE DRAWINGS

Figure 4A:
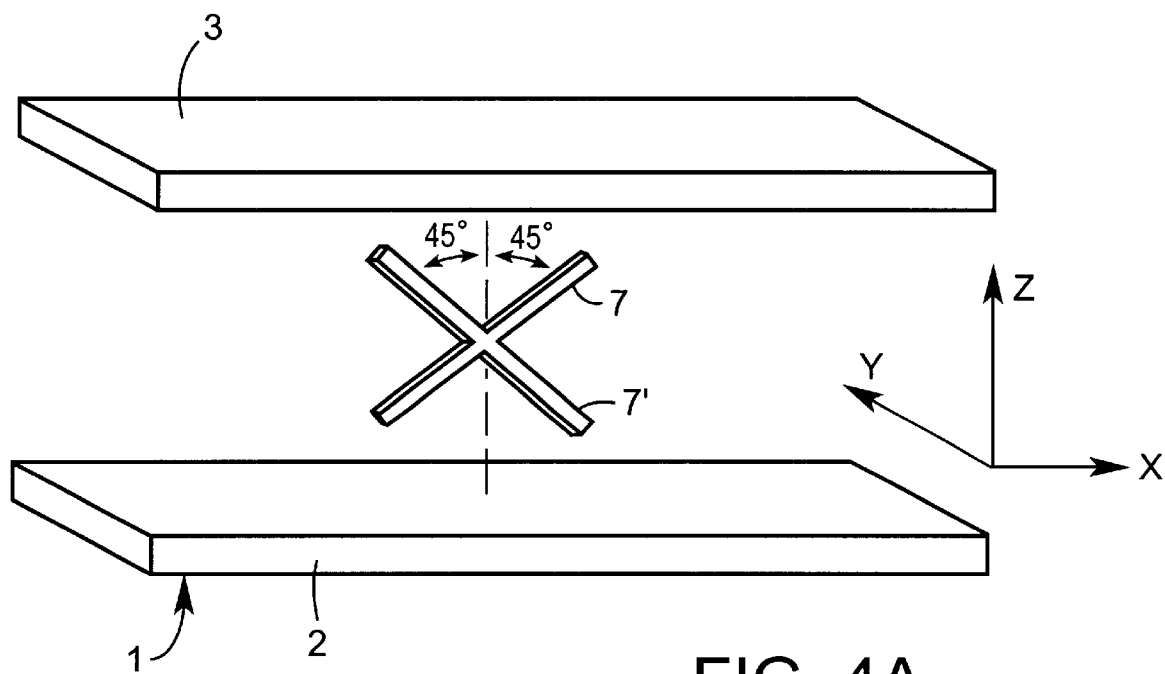
Figure 4B:
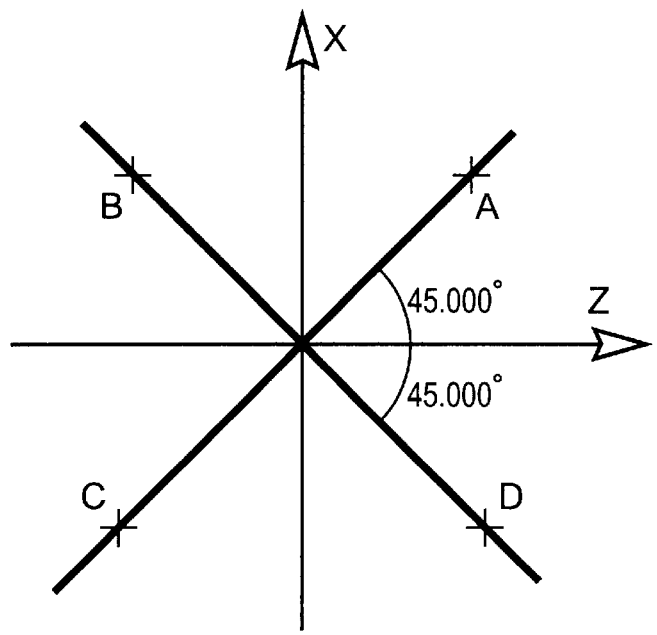
Figure 5:
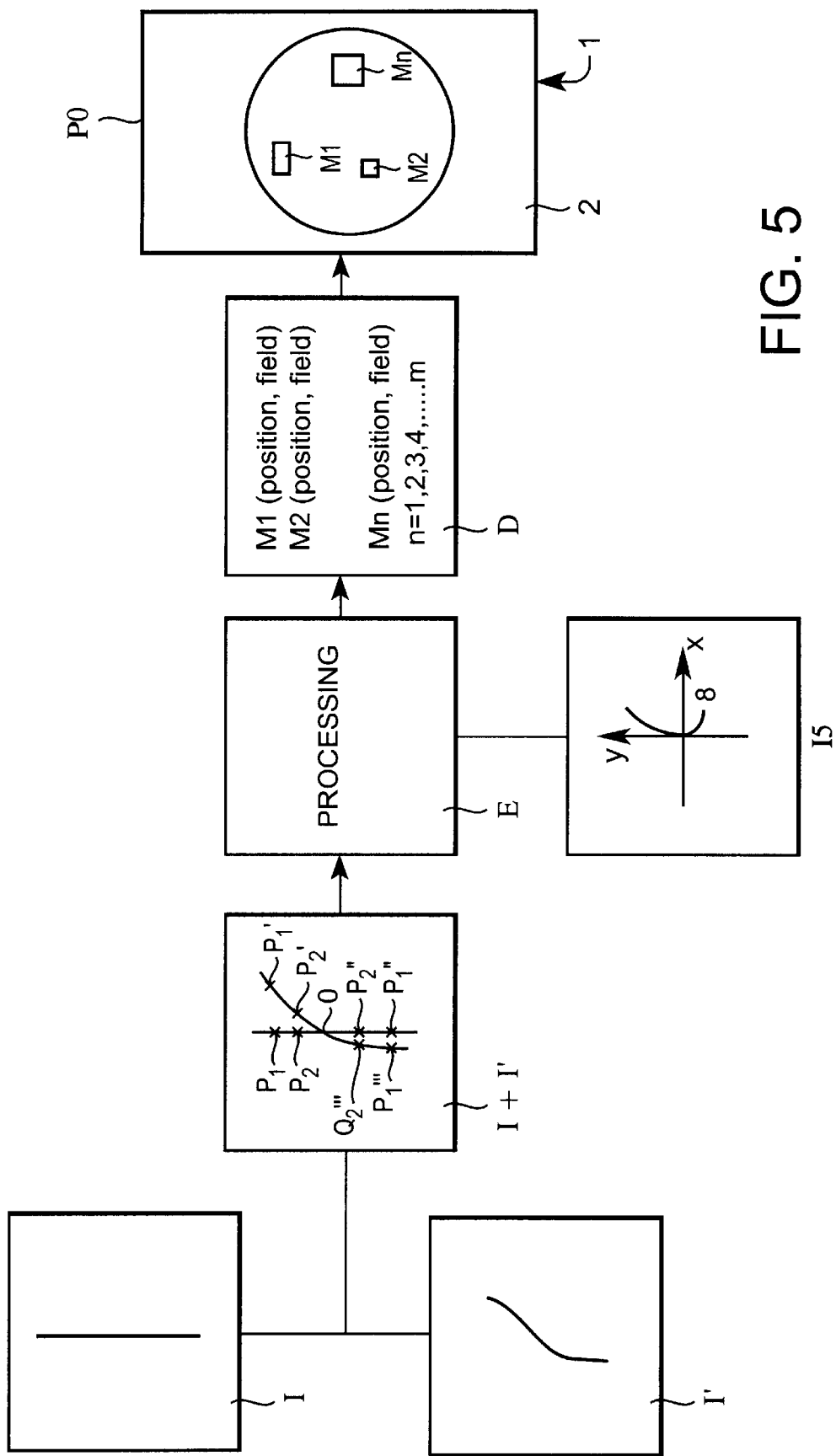
FIG. 5 shows a flow chart of the method according to the invention.

With reference to FIGS. 1 to 5, the method of the invention provides Nuclear Magnetic Resonance imaging of a test element and comparison of the deviations of said real detected image with a nominal, ideal image of the test element. In FIG. 5, the process is shown with reference to the test element example of FIGS. 1A and 1B.

Figure 1A:
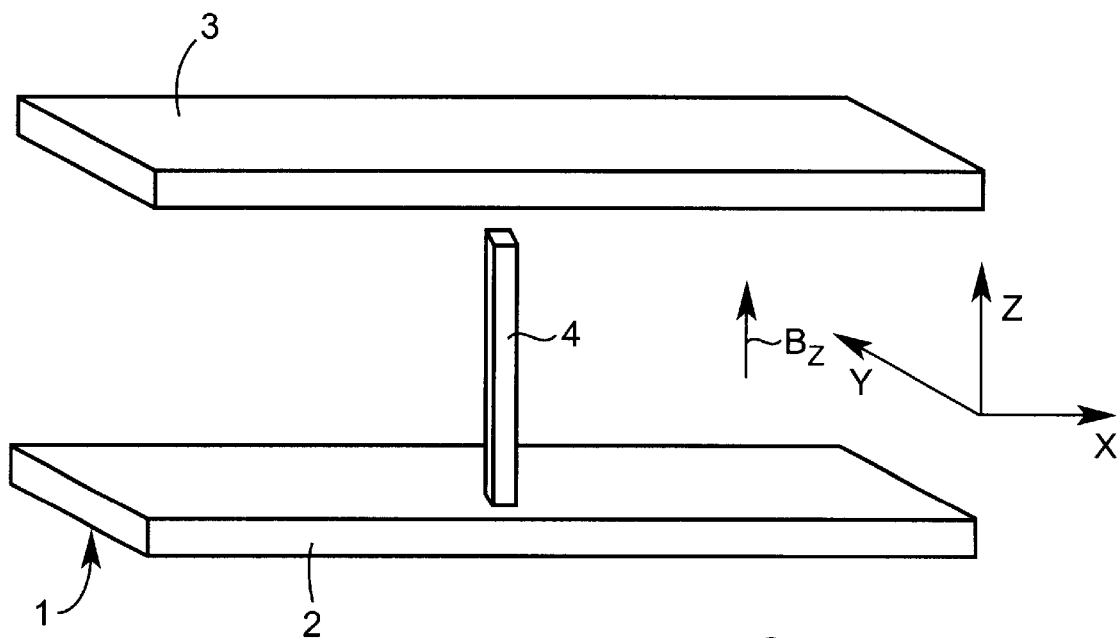
Figure 1B:
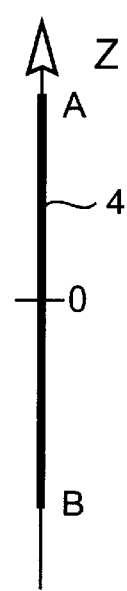

In FIG. 5, I denotes the ideal image and I' the actually detected image of the test element 1, according to FIGS. 1A and 1B. I+I' denotes the comparison between the two images. This is obtained by superposing the two images I, I'. In fact, verification might as well be carried out visually, and aberrations be detected by manual measurement on the monitor. However, depending on the desired automation degree, such graphically represented verification may be obtained automatically by pure computation, whereas the visual image may only be a graphic representation of the information obtained from computations.

Then, aberration values, i.e. substantially the differences between points P1 and P1' to Pn and Pn' are used for computing the corrections to be applied to the magnetic structure 1.

Such corrections are provided in the form of magnetic elements M1, M2, Mn, having a unit value or being a fraction or a multiple of said unit value, or in the form of one or more elements with a predetermined volume of ferromagnetic material, which have to be positioned at predetermined locations of the magnetic structure to correct any aberration of the magnetic field, here of the static magnetic field denoted by Bz in the figures.

Preferably, the magnetic field is described with the help of a polynomial expansion in spherical harmonics which relate coefficients of different orders to combinations of sine and cosine functions. This description allows to produce test elements whose image contributions only relate to defined coefficients describing the magnetic field in spherical harmonics and have very simple geometries and constructions for this purpose.

Thus, for instance, the test element of FIGS. 1A and 1B allows separate detection of (2 0) cosine and of (4 0) cosine coefficients.

The following description will refer to the different geometries shown in FIGS. 1A and 1B to 4A and 4, while explaining the process in greater detail.

Referring to FIGS. 1A and 1B, the test element consists of a rectilinear baffle 4, which is positioned in the plane parallel to the magnetic field Bz, obviously between the two poles 2, 3 for generating the magnetic field.

The rectilinear baffle is oriented along the Z axis. In this condition, the tesseral coefficients with a non-zero degree give a null contribution on the axes.

The ideal image which should be obtained is denoted by I in FIG. 1. If the field is inhomogeneous, the actual image might be the one denoted by I' in FIG. 5.

In this case, by adding the distortion of each point along an axis perpendicular to the field and selected in accordance with the direction of the reading gradient, for instance the x axis, to the point symmetric thereto with respect to the origin 0, i.e. the central point of the baffle, the contributions from the other symmetries are suppressed (see FIG. 5 I+I', IS). By assigning this sum divided by two to each point and to its symmetric counterpart (P, P', P1", P'", P2, P2', P2", P2'"), a curve (resulting from symmetrized construction) is obtained in a chart being a function of the distance from the center, which describes the distortion related to the relevant symmetry. This curve consists of powers of r, where r is the distance from the center of the image, i.e. from the origin, in coordinates normalized to the radius of a sphere having a predetermined diameter, e.g. 80 mm.

The inhomogeneities of the magnetic field Bz in the points symmetrized on the y axis are described by the following function:

$$\delta = a_{20}^{\cos} r^2 + a_{40}^{\cos} r^4 + O(r^6)$$

The distortion of the image is proportional to inhomogeneity according to the following formula, indicated as (1):

$$\Delta X[l] = \frac{\Delta B[MHz]}{f_{samp}[MHz]} FOV[l] \quad (1)$$

Where l corresponds to the unit of image distortion normalized to the radius of the above defined sphere.

Considering a number of 256 pixels, the above formula gives:

$$\Delta X[pixels] \cong 2.56 \cdot 10^{-4} \frac{f_{magnet}[MHz]}{f_{sampling}[MHz]} (a_{20}^{\cos} r^2 + a_{40}^{\cos} r^4)$$

By approximating the distortion of symmetrized points as a function of their distance from the center of the magnet by a polynomial function like the following:

$$y = \beta_{20} r^2 + \beta_{40} r^4$$

The desired coefficients are obtained, i.e. (2 0) cosine and (4 0) cosine coefficients.

If the magnet in use has a frequency of 7.692462 MHz and a spin echo sequence with a sampling frequency of 217 Khz, approximation processed by a polynomial like the one described above gives the following coefficients:

$$y = 8.3385_r^4 - 25.7204_r^2$$

By applying the above, the following is obtained:

$$a_{20}^{\cos} = \frac{f_{sampling}[MHz]}{f_{magnet}[MHz]2.56 \cdot 10^{-4}} \beta_{20} =$$

$$\frac{0.00217}{7.682462 \cdot 2,5610^{-4}} (-25,7204) \Rightarrow a_{20}^{\cos} = -28 \, ppm$$

Figure 2A:
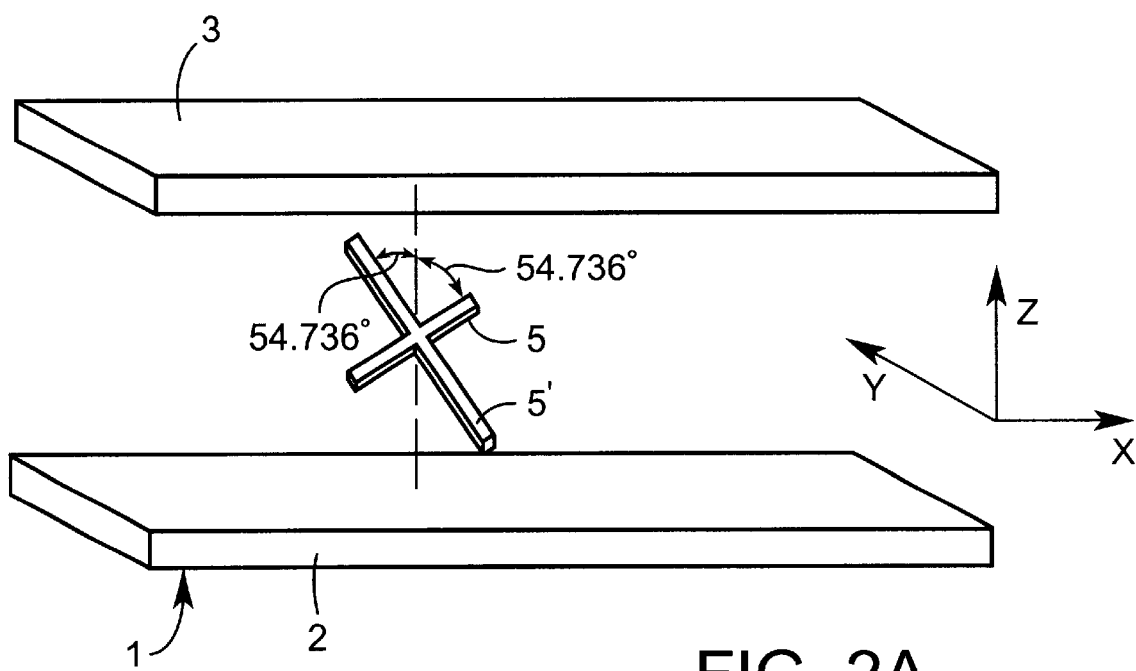
Figure 2B:
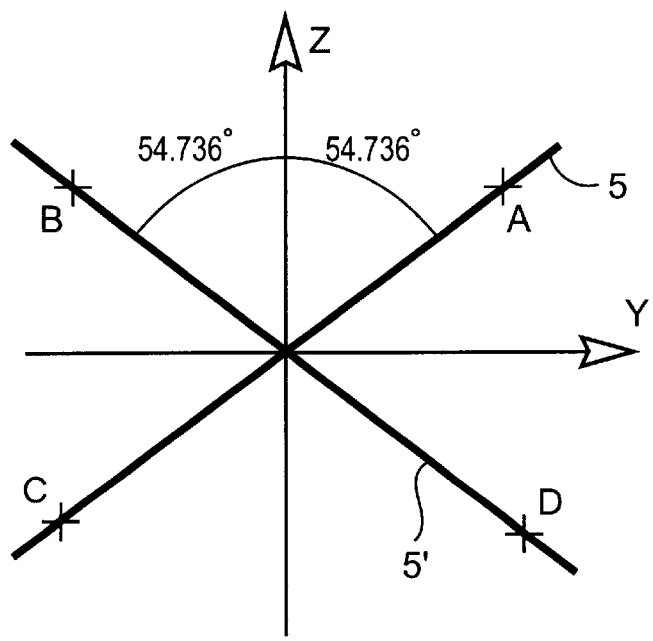

In FIGS. 2A and 2B, in the XY plane, i.e. in the axial section plane, two baffles are positioned, to form an angle of 54.7360° with the Y axis. This suppresses the effect of distortion of the (2 0) cosine coefficient.

Figure 6:
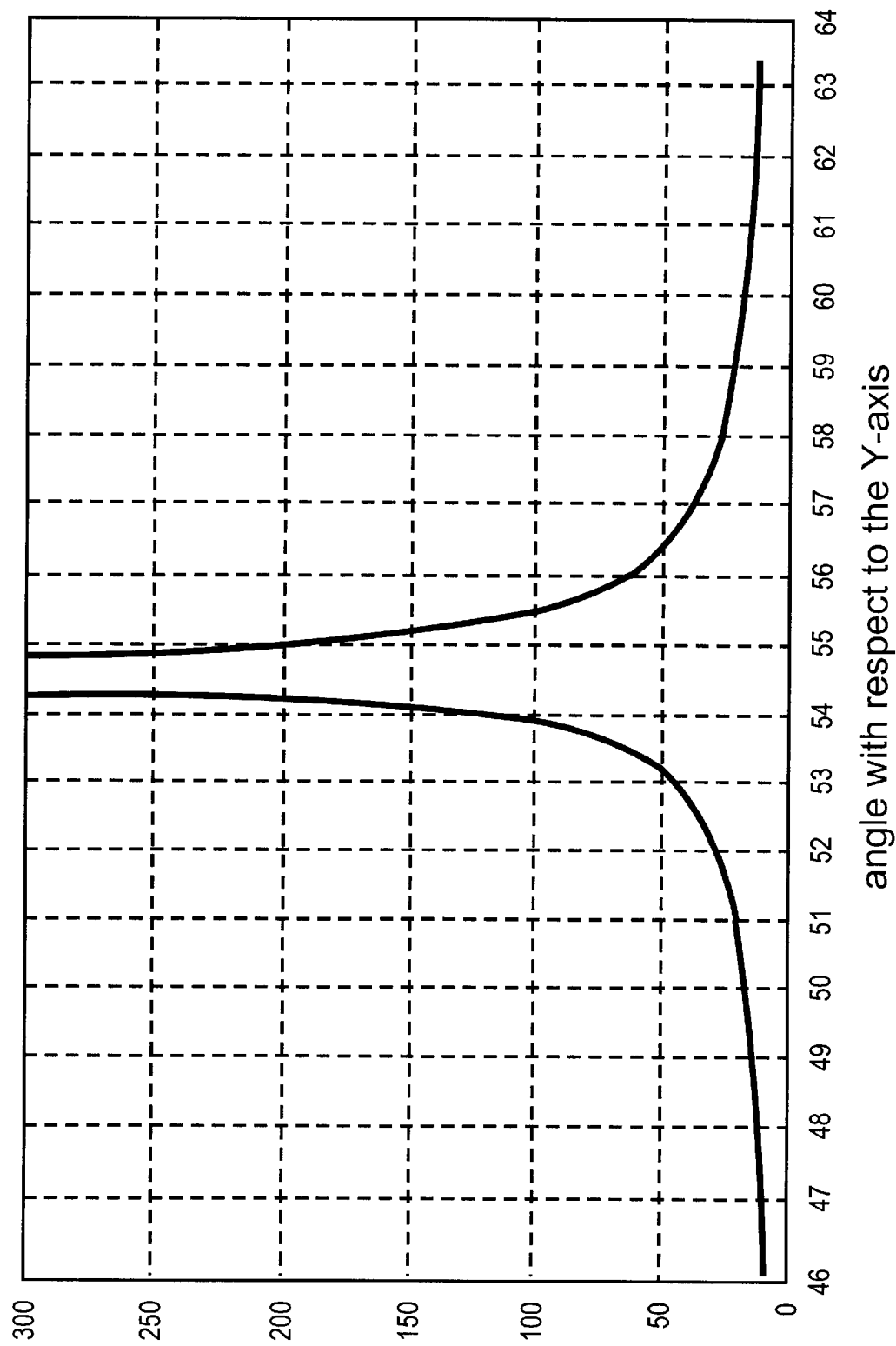
FIG. 6 shows the ratio of two coefficients as a function of the angle formed by the test baffle in the specific plane.

FIG. 6 shows a chart of the (2 2) to (2 0) coefficients ratio as a function of the angular position of the baffles 5 and 5'. The peak apparently corresponds to the angle of 54.736°.

Here again, in order to detect distortions and to perform symmetrization, for each point the symmetric points with respect to the origin are considered, which are four when two baffles are provided.

In order to detect distortion for (2 2) cosine, the distortions of each point and of its symmetric counterparts are summed up and divided by 4. Similarly to the above, the chart of a distortion curve, being a function of the distance r from the center of the image is obtained. This curve may also be further symmetrized with respect to the origin to suppress odd terms. From the basic relation indicated in the previous paragraph and identified by numeral (1), which describes the ratio between the symmetrized distortion of the image and the inhomogeneity of the magnetic field, the following is obtained:

$$\Delta X[pixels] \cong 1.81 \cdot 10^{-4} \frac{f_{magnet}[MHz]}{f_{sampling}[MHz]} (a_{22}^{\sin} r^2 + O(r^4))$$

Approximation with the following polynomial $$y = \beta_1 r^2 + \beta_2 r^4$$

gives the (2 2) cosine coefficient, by equating quadratic terms.

In order to compute the (2 1) sine coefficient, the following operation has to be performed, where A, B, C, D indicate the distortions of points A, B, C, D, symmetrical to A.

$$\frac{(A - D) - (B - C)}{4}$$

Hence, the chart of the distortion curve, being a function of the distance r from the center of the image is obtained:

$$\Delta X[pixels] \cong 1.92 \cdot 10^{-4} \frac{f_{magnet}[MHz]}{f_{sampling}[MHz]} (a_{21}^{\sin} r^2 + O(r^4))$$

Here again approximation is performed by the following polynomial:

$$y = \beta_1 r^2 + \beta_2 r^4$$

And by equating quadratic terms the (2 1) sine coefficient is obtained.

Figure 3A:
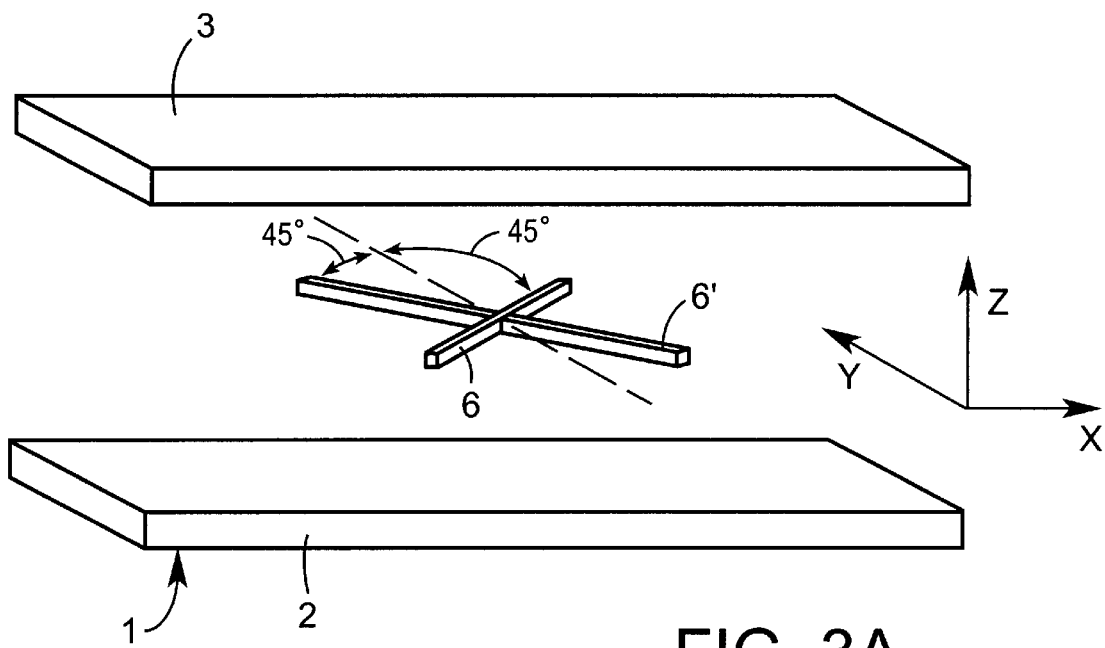
Figure 3B:
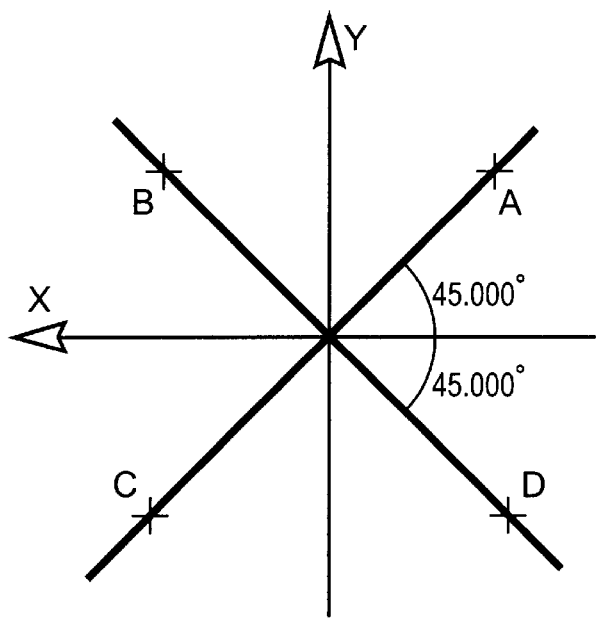

With reference to FIGS. 3A and 3B, the latter show the test element 6, 6' for measurement of the (2 2) sine coefficient.

In this case, two baffles are positioned, as in the example of FIGS. 2A and 2B, in the XY plane, i.e. in the coronal section plane, but they are disposed along the bisectors of the Cartesian coordinates XY.

Symmetrization of distortions is performed as described for (2 1) sine coefficient determination. In this case, the law of distortion provides the equation:

$$\Delta X[pixels] \cong 1.92 \cdot 10^{-4} \frac{f_{magnet}[MHz]}{f_{sampling}[MHz]} (a_{21}^{\sin} r^2 + O(r^4))$$

As described above, approximation is performed by the following polynomial:

$$y = \beta_1 r^2 + \beta_2 r^4$$

And by equating quadratic terms the (2 2) sine coefficient is obtained.

The (2 1) cosine coefficient is measured substantially as described above. In this case, baffles 7, 7', like those 6, 6' of FIGS. 3A and 3B, even as regards angular arrangement are positioned in the sagittal section plane, i.e. in the XZ plane, as shown in FIGS. 4A and 4B. The operations are the same, and the following law for describing the distortion curve is obtained:

$$\Delta X [\text{pixels}] \cong 1.92 \cdot 10^{-4} \frac{f_{magnet}[\text{MHz}]}{f_{sampling}[\text{MHz}]} (a_{21}^{\sin} r^2 + O(r^4))$$

By obtaining, as described herein, the coefficients of the most relevant degrees of the polynomial expansion in spherical harmonics of the field, it is possible to redetermine, on the basis of nominal coefficients, the correcting magnetic charges as well as the positions thereof in the magnetic structure, whereby the magnetic field homogeneity may be restored within predetermined tolerances, to suppress the coarsest distortions.

In FIG. 5, the above described steps are indicated in box E, IS, whereas the following steps for determining the magnetic charges or the ferromagnetic correcting elements M1, M2, . . . , Mn and their position as well as their actual magnetic structure positioning 1, 2, 3 on the magnetic structure are schematically indicated in boxes D, PO.

The operations for computing and determining distortions may be performed outside the machine, or the software for automatically determining correction magnetic charges and their position from the comparison of data detected in the measuring session with stored nominal data, in relation to the different test elements 4, 5, 6, 7, as shown in the schematic flow chart of FIG. 5, may be loaded in the Nuclear Magnetic Resonance machine.

Figure 7:
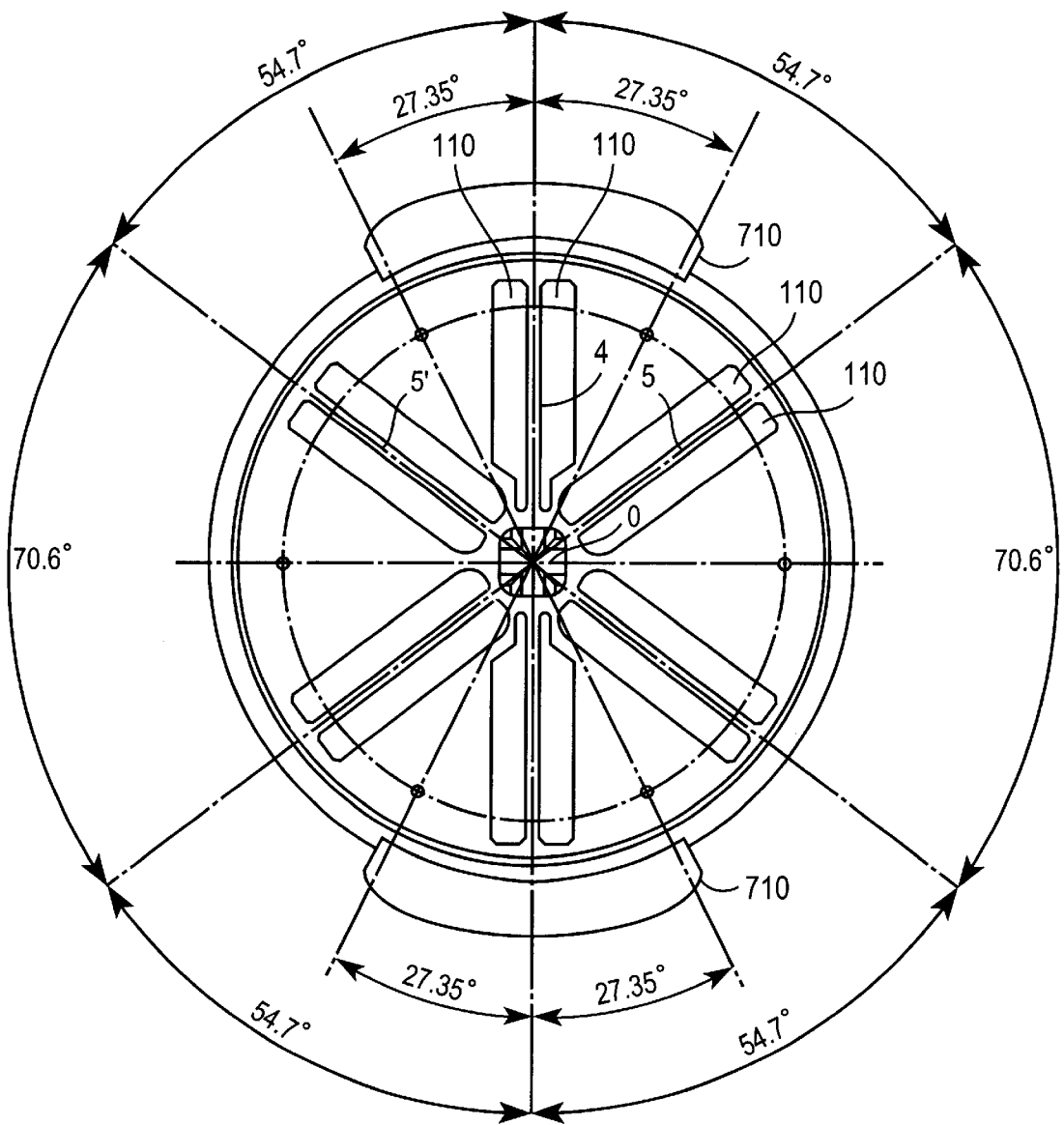
FIGS. 7 and 8 are two views along two axes, of the composite test element according to a preferred embodiment of the invention.
Figure 8:
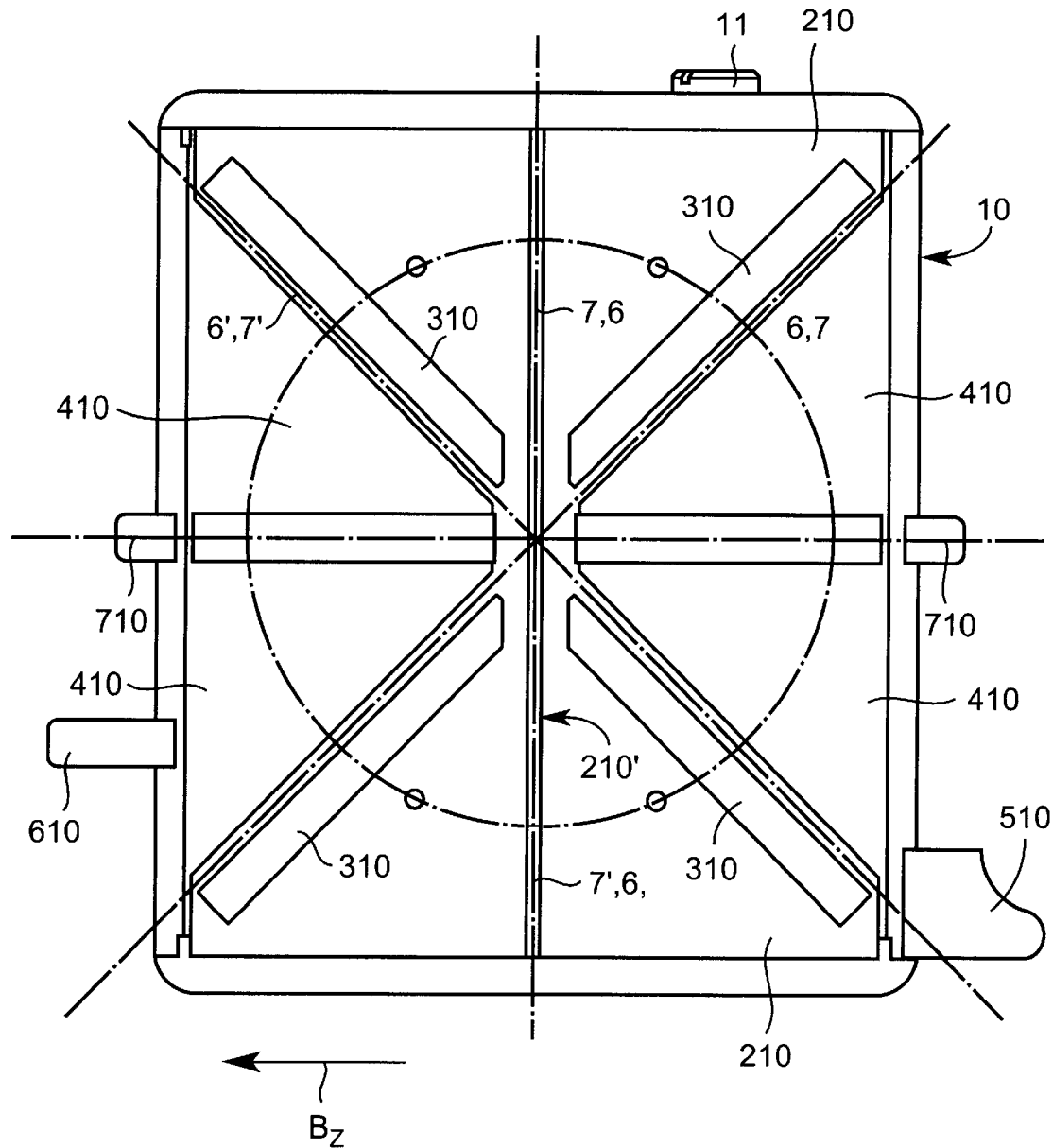

FIGS. 7 and 8 show a preferred embodiment of a test element for performing the measurement and correction procedures indicated and detailed herebefore.

This test element has all the individual elements 4, 5, 5', 6, 6', 7, 7' permanently therein. These may be mounted in a fixed manner in the test element, but may be also possibly removable or a set of individual test elements may be provided, each with the baffles in one of the configurations described in FIGS. 1, 2, 3, 4.

The test element 10 consists of a cylindrical Plexiglas container 1, wherein the baffles 4, 5, 5', 6, 6' and 7, 7'. The baffles 6, 7 and 6', 7' are identical, with the test element, resting on the circular base, only having to be rotated through 90°. Obviously, as illustrated and denoted by 7, 6 and 7', 6', there may be also provided a set of baffles in a plane perpendicular to the one containing the first baffles 6, 7 and 6', 7', so that the test element does not have to be moved or oriented several times, and that a single first positioning may be needed to perform any further measurement. The baffles 4, 5, 6, 7, 5', 6', 7' extend along axes which form angles indicated with reference to FIGS. 1, 2, 3, 4, all intersecting in the origin 0, which is provided in coincidence with the median point of the cylindrical test element 10.

The baffles 4, 5, 6, 7, 5', 6', 7' consist of thin diaphragms or ribs separating apertures 110 formed in a plexiglas disk mounted inside the test element 10.

As for baffles 6, 7, 6', 7', these are formed in diametral walls of the test element, in a single diametral wall if the test element is to be rotated for performing different measurements, or in two perpendicular diametral walls. The two walls are denoted by 210 and 210' in FIG. 8. The baffles consist of thin ribs separating apertures 310, 410.

In the upper portion, i.e base of the test element 10, an opening is provided which may be sealed by a plug 11, whereby the cylindrical sealed container-like test element is filled with a liquid which generates Nuclear Magnetic Resonance signals, e.g. simple water , and which completely fills the test element, including the different apertures 110, 310, 410 which define the baffles 4, 5, 5', 6, 6', 7, 7'.

Upon measuring, the test member is inserted inside the receiving coil of a Nuclear Magnetic Resonance imaging machine in such a position that the axis of the cylindrical member is oriented perpendicular to the static magnetic field indicated by the arrow Bz in FIG. 8. The member is positioned with the baffles, i.e. walls 210, oriented parallel to the two Cartesian axes which define the planes perpendicular to the direction of the static magnetic field, i.e. the faces of the two opposite poles 2, 3, whereas the baffle 4 is oriented along the y axis of said plane, i.e. according to one of the reading gradients.

The member has extensions 510, 610, 710 for easy positioning and grasping thereof.

The member as shown in FIGS. 7 and 8 is particularly suitable for measurement of field coefficients as described hereinbefore with reference to the method and to FIGS. 1 to 5.

Obviously, in combination with the test member, a Nuclear Magnetic Resonance imaging machine has to be provided which has at least one magnetic structure for generating static magnetic fields with a predetermined orientation; electronic means and coils for generating spin echo sequences, as well as selecting, reading and encoding gradients; coils for receiving echoes and an electronic signal processing unit, said electronic unit being programmed for performing at least some of the steps of the method described hereinbefore, and there being provided, in combination therewith, at least one set of correcting magnetic charges, whose values are fractions or multiples of magnetic charge units.

The invention is not limited to what has been described and illustrated herein, but may be widely varied, especially as regards construction, without departure from the guiding principle disclosed above and claimed below.

What is claimed is:

1. A method for performing verification measurement and correction of magnetic field in a magnetic structure of a Nuclear Magnetic Resonance imaging machine, the method comprising:

providing a test member having such characteristics as to generate a theoretical image using Nuclear Magnetic Resonance imaging;

obtaining a Nuclear Magnetic Resonance image from said test member;

comparing the theoretical image with the obtained image;

determining differences between the obtained image and the theoretical image;

computing correction parameters and corresponding positions of said correction parameters on the magnetic structure based on the determined differences;

choosing a mathematical theoretical function describing the magnetic field; and selecting a test member so that the test member has a structure suited to the mathematical theoretical function describing the field and which test member produces one or more selected images, each of these selected images being correlated to one or to a limited number of selected low order coefficients of the mathematical theoretical function describing the magnetic field such that the differences between the theoretical image of the test member and the obtained image of the test member depend only on the one or the limited number of selected coefficients of the mathematical theoretical function describing the magnetic field.

2. The method as claimed in claim 1, the mathematical theoretical function for describing the magnetic field is choosen as a representation of the magnetic field in spherical harmonics, and such that only different orders and degrees of harmonics and hence of coefficients of the field may be examined seperately.

3. The method as claimed in claim 1, wherein the test member has elements which do not emit Nuclear Magnetic Resonance signals and are related to a definite harmonic or to precise coefficients of a certain order of the mathematical theoretical function of the magnetic field corresponding to a polynomial expansion, there being provided means for application of reading gradients of the magnetic field, which only detect an echo signal along certain directions, said certain directions being selected in such a manner as to suppress contributions from the magnetic field described by coefficients other than coefficients being examined, to isolate the contribution of the coefficients being examined from other remaining coefficients.

4. The method as claimed in claim 3, wherein the define harmonic is a spherical harmonic.

5. The method as claimed in claim 4, further including the following steps:
   a) detecting the image obtained of the test member;
   b) symmetrizing deviations between the obtained image and the theoretical image with respect to a center of the obtained image or to a predetermined origin of a coordinate system for the mathematical theoretical function;
   c) defining a curve of symmetrized deviations having relevant field coefficients as a variable;
   d) determining a polynomial for approximating the curve of symmetrized deviations, deriving from the differences between the obtained image and the theoretical image;
   e) determining the relevant field coefficients based on the system of steps c) and d);
   f) computing, from the mathematical theoretical function in spherical harmonics of the field, such number, magnitude and position on the magnetic structure of the correction parameters as magnetic charges or volumes of ferromagnetic material as to bring the measured values of the field coefficients back within nominal values corresponding to the homogeneity characteristics of the field required for detecting useful Nuclear Magnetic Resonance images; and
   g) manually positioning correcting elements corresponding to the correction parameters.

6. The method as claimed in claim 5, further comprising, once correction has been performed, repeated steps a) to f) to verify effectiveness of said correction and, when necessary, an additional correction step g) may be performed.

7. The method as claimed in claim 6, wherein the elements for verifying the different coefficients may be progressively mounted on the test member or fixedly provided thereon.

8. The method as claimed in claim 1, wherein the test member corresponds to at least one harmonic or to at least one set of coefficients and is made consistently with the selected mathematical description of the field or eventually to the symmetries of the magnetic structure.

9. The method as claimed in claim 1, wherein the method provides a manual graphic comparison between the obtained image and the theoretical image wherefrom a mathematical computation is performed to determine correction data.

10. The method as claimed in claim 1, wherein the Nuclear Magnetic Resonance imaging machine has a memory wherein the theoretical image is loaded.

11. The method as claimed in claim 1, wherein the method it provides that the Nuclear Magnetic Resonance imaging machine determines quantitatively differences between the theoretical image and the obtained image by computation of a distance in pixels of a point or portion or area of the obtained image from a position of a corresponding point or area of the theoretical image.

12. The method as claimed in claim 1, wherein the test member has an undetectable portion in the form of a rib, step or baffle having a longitudinal orientation parallel to the magnetic field and disposed in an axial section plane of the magnetic field, when the latter is described by spherical harmonics, said baffle being related to the detection of (2 0) cosine and (4 0) cosine coefficients only, with reference to a mathematical description in spherical harmonics.

13. The method as claimed in claim 12, wherein the method provides the application of so-called reading field gradients oriented perpendicular to the baffle.

14. The method as claimed in claim 12, wherein two crossed baffles are used as the test member, which form an angle of 109.472°, symmetrically with respect to one of two axes describing the axial section plane of the magnetic field, which baffles are related to measurement of contribution of the magnetic field only relating to (2 2) cosine and (2 1) sine coefficients.

15. The method as claimed in claim 12, wherein two crossed baffles are used as the test member, forming an angle of 90', symmetrically with respect to an axis which describes a coronal section plane of the magnetic field, and being related to measurement of (2 2) sine coefficients only, whereas, by the same configuration of baffles though disposed in a sagittal section plane, field contributions of (2 1) cosine coefficients are only detected.

16. The test member for verification measurements and corrections of magnetic fields in Nuclear Magnetic Resonance machines, wherein the test member comprises at least the baffle as claimed in claim 12.

17. The test member as claimed in claim 16, wherein said baffle is made of a plastic material.

18. The test member as claimed in claim 16, includes a central rectilinear baffle which is crossed, with reference to a plane parallel to a peripheral edge, by two crossed baffles, passing through a median area of the rectilinear baffle and forming, symmetrically with respect to the rectilinear baffle, an angle of 109.472°, whereas two additional crossed baffles are provided in a plane perpendicular to the rectilinear baffle and containing the other sides thereof, which form, symmetrically with respect to said rectilinear baffle an angle of 90° and intersect the rectilinear baffle in the central area, yet two additional baffles, crossed at 90' being provided in another plane perpendicular to the plane containing the two baffles crossed at 90 °.

19. The test member as claimed in claim 16, wherein the baffles are formed by thin walls separating aperatures in axial or diametral walls intersecting along the three main directions of a Cartesian system.

20. The test member as claimed in claim in claim 19, wherein the baffles or the walls are mounted permanently in a plastic container, which is filled with a liquid or a substance emitting a Nuclear Magnetic Resonance signal, the container being water-tight and provided with a sealable filling opening.

21. The test member as claimed in claim 20, wherein the liquid is water.

22. The test member as claimed in claim 16, wherein the test member comprises a water-tight cylindrical container.

23. The test member as claimed in claim 16, characterized in that the baffles are made of a material suitable for generating Nuclear Magnetic Resonance signals, whereas the filling material is such that it does not emit Nuclear Magnetic Resonance signals, the generation of separator surfaces of a predetermined shape, for separating contrasting image areas, being relevant.

24. The test member as claimed in claim 16, wherein the baffle is made of Plexiglass.

25. The method as claimed in claim 1, wherein the comparing step comprises comparing signals from which the obtained image is constructed to a set of theoretical signals based on the theoretical image.

26. The method as claimed in claim 25, wherein the determining step comprises determining the differences between the signals from which the obtained image is constructed to the set of theoretical signals based on the theoretical image.

27. The method as claimed in claim 1, wherein the function is a polynomial expansion.

28. The method as claimed in claim 27, wherein the polynomial expansion is selected in spherical harmonics.

29. The Nuclear Magnetic Resonance imaging machine, comprising a magnetic structure for generating static magnetic fields, which defines a cavity for accommodating bodies or body parts to be examined; a coil for generating sequences for exiting, selecting and reading Nuclear Magnetic Resonance echoes; a coil for receiving said echoes; a unit for processing the echo signals received, to generate digital images therefrom to be a displayed on display, the processing unit is of the programmable type and has at least one memory which stores an algorithm for measuring field coefficients according to the method comprising:

providing a test member having such characteristics as to generate a theoretical image using Nuclear Magnetic Resonance imaging;

obtaining a Nuclear Magnetic Resonance image from said test member;

comparing the theoretical image with the obtained image;

determining differences between the obtained image and the theoretical image;

computing correction parameters and corresponding positions of said correction parameters on the magnetic structure based on the determined differences;

choosing a mathematical theoretical function describing the magnetic field; and selecting the test member so that the test member has a structure suited to the mathematical theoretical function describing the field and which test member produces one or more selected images, each of these selected images being correlated to one or to a limited number of selected low order coefficients of the mathematical theoretical function describing the magnetic field such that the differences between the theoretical image of the test member and the obtained image of the test member depend only on the one or the limited number of selected coefficients of the mathematical theoretical function describing the magnetic field, whereas, in combination with said machine, there is provided a test member wherein the test member has an undetectable portion in the form of a rib, step or baffle having a longitudinal orientation parallel to the magnetic field and disposed in an axial section plane of the magnetic field, when the latter is described by spherical harmonics, said baffle being related to the detection of (2 0) cosine and (4 0) cosine coefficients only, with reference to a mathematical description in spherical harmonics, wherein the theoretical image may be stored in the processing unit of the machine, and at least on set of correcting magnetic charges.

30. A method for performing verification measurement and correction of a magnetic field in a magnet structure of a Nuclear Magnetic Resonance imaging machine, method comprising:

providing a test member having characteristics to generate a theoretical image using Nuclear Magnetic Resonance imaging;

obtaining a Nuclear Magnetic Resonance image from said test member;

comparing received signals from which the obtained image is reconstructed with a corresponding set of signals related to the theoretical image;

determining differences between the received signals and the set of signals corresponding to the theoretical image;

computing correction parameters and corresponding positions of said correction parameters on the magnetic structure based on the determined differences;

choosing a mathematical theoretical function describing the magnetic field; and selecting the test member so that the test member has a structure suited to the mathematical theoretical function describing the magnetic field and which test member produces one or more selected images, each of these elected images being correlated to one or to a limited number of selected low order coefficients of the mathematical theoretical function describing the field, such that the differences between the theoretical image of the test member and the obtained image of the test member depend only on the one or the limited number of selected coefficients of the mathematical theoretical function describing the magnetic field.

* * * * *